United States Patent [19]

Mitsui et al.

[11] Patent Number: 5,053,356
[45] Date of Patent: Oct. 1, 1991

[54] METHOD FOR PRODUCTION OF A SEMICONDUCTOR LASER

[75] Inventors: Shigeru Mitsui; Ryo Hattori, both of Itami, Japan

[73] Assignee: Mitsubishi Denki Kabushiki Kaisha, Tokyo, Japan

[21] Appl. No.: 587,968

[22] Filed: Sep. 25, 1990

Related U.S. Application Data

[62] Division of Ser. No. 379,246, Jul. 12, 1989.

[30] Foreign Application Priority Data

Jul. 20, 1988 [JP] Japan .................................. 63-182392

[51] Int. Cl.$^5$ ............................................ H01L 21/20
[52] U.S. Cl. ...................................... 437/129; 437/108; 437/974; 357/17; 148/DIG. 25; 148/DIG. 95
[58] Field of Search ............... 437/129; 148/DIG. 25, 148/DIG. 95; 357/17; 372/45, 46

[56] References Cited

U.S. PATENT DOCUMENTS

| | | | |
|---|---|---|---|
| 4,352,187 | 9/1982 | Amann | 372/46 |
| 4,667,332 | 5/1987 | Mihashi et al. | 357/17 |
| 4,799,228 | 1/1989 | Nagasaka et al. | 357/17 |
| 4,856,013 | 8/1989 | Iwano | 372/45 |
| 4,916,709 | 4/1990 | Ota | 372/46 |
| 4,946,802 | 7/1990 | Shima et al. | 148/DIG. 95 |

FOREIGN PATENT DOCUMENTS

| | | |
|---|---|---|
| 0273726 | 7/1988 | European Pat. Off. |
| 2856507 | 7/1980 | Fed. Rep. of Germany |
| 3234389 | 3/1984 | Fed. Rep. of Germany |
| 3736497 | 5/1988 | Fed. Rep. of Germany |
| 3908305 | 9/1989 | Fed. Rep. of Germany |
| 61-125184 | 6/1986 | Japan |
| 62-142387 | 6/1987 | Japan |
| 62-166587 | 7/1987 | Japan |
| 62-179790 | 8/1987 | Japan |
| 100788 | 5/1988 | Japan ................................. 437/129 |
| 63-269593 | 11/1988 | Japan |

OTHER PUBLICATIONS

"A New High-Power Output Semiconductor Laser Used for Optical Disk Drive," Semicon News, 1988, 6, p. 98.

"A New Self-Aligned Structure for (GaAl) High Power Lasers with Selectively Grown Light Absorbing GaAs Layers Fabricated by MOCVD", by Nakatsuka et al., Japanese Journal of Applied Physics, vol. 25, No. 6, Jun. 1986, pp. L498-L500.

"High-Power Operation of Index-Guided Inverted Channel Substrate Planar (ICSP) Lasers" Electronics Letters, 15th Aug. 1985, vol. 21, No. 17, pp. 751-752.

"Complementary Self-Aligned Laser by Metalorganic Chemical Vapour Deposition," Electronics Letters, 26th Sep. 1985, vol. 21, No. 20, pp. 903-905.

"High Power Ridge-Waveguide AlGaAs GRIN-SCH Laser Diode," Harder et al., Electronics Letters, vol. 22, No. 20, Sep. 25, 1986, pp. 1081-1082.

"Uniformity of an Embedded Stripe Large Optical-Cavity GaAs/GaAlAs Double-Heterostructure Laser Grown by Metallo-Organic Chemical Vapor Deposition," J. Appl. Phys., vol. 59, No. 4, Feb. 15, 1986, pp. 1028-1030.

Primary Examiner—Brian E. Hearn
Assistant Examiner—Linda J. Fleck
Attorney, Agent, or Firm—Leydig, Voit & Mayer

[57] ABSTRACT

A semiconductor laser particularly adapted for operation in the self-pulsation mode and method for production thereof. A central mesa is formed in the upper cladding layer and normally requires relatively thick sections at either side of the mesa in order to form a wageguide of sufficient thickness to cause self-pulsation operation. In order to control the thickness of the upper cladding layer bounding the mesa, the mesa is first formed by etching the regions bounding the mesa to relatively thin sections capable of ready gauging by optical interferometry. A composite upper clading layer is then formed by utilizing MOCVD crystal growth techniques to form a buffer layer on the upper cladding layer bounding the mesa, the buffer layer having an aluminum content about the same as the aluminum content of the AlGaAs upper cladding layer. The composite layer functions as a comparatively thick waveguide which can be formed to the necessary thickness with adequate accuracy to provide a high yield when producing self-pulsation lasers according to the present invention.

6 Claims, 3 Drawing Sheets

METHOD FOR PRODUCTION OF A SEMICONDUCTOR LASER

This is a division of application Ser. No. 379,246, filed July 12, 1989.

FIELD OF THE INVENTION

This invention relates to semiconductor lasers, and more particularly to a semiconductor laser capable of reliable operation in the self-pulsation mode with low optical feedback.

BACKGROUND OF THE INVENTION

In all applications, such as the reading laser source in CD laser technology, minimization of the influence of optical feedback from external sources into the laser cavity is very important. The signal-to-noise ratio (S/N) in a laser device, depends on the coherent length of the laser beam $L_c$, and the quantity of light feedback from the lens system to the laser cavity, in other words on optical feedback. Lasing occurs in the inner cavity mode and in the external cavity mode. The inner cavity mode is that which is achieved as a result of recombinations within the optical cavity resulting from injected carriers. The external cavity mode is occasioned by photons which reenter the cavity and experience collisions, thereby to alter the lasing signal in a manner which depends on the phase and frequency of the noise.

Turning first to the optical feedback aspect of the S/N problem, it is conventional to control the front facet reflectance in order to improve S/N. With low reflectance at the front facet (for example, at reflectance less than about 10%), the lasing mode of operation becomes the so-called multi-mode. At low values of optical feedback in that mode, the signal-to-noise ratio (S/N) is relatively high. However, as the optical feedback ratio increases (ratios greater than about 0.1%), S/N decreases because of the increase of the influence of optical feedback from sources external to the laser.

On the other hand, if the front facet reflectance is made relatively high (for example, greater than about 10%), the lasing mode becomes the so-called single-mode. With a high reflectance front facet laser, at intermediate optical feedback ratios (such as in the range between 0.01 to 0.1%), the mode competition noise increases substantially and as a result S/N decreases substantially compared to those characteristics at or near zero optical feedback ratio. At high optical feedback ratios, the lasing mode switches to multi-mode operation, and the signal-to-noise ratio increases to approach the S/N ratio achieved at zero optical feedback.

In summary with respect to control of facet reflectance as a means of controlling the signal-to-noise ratio, it is seen that such control is possible, but there are limits to the degree of control which can be exercised.

With respect to the second factor noted above which affects the signal-to-noise ratio, the coherent length of the laser beam $L_c$ also has an effect. It has been found that if the laser operates in the self-pulsation mode, the coherent length is decreased, and such decrease in coherent length favorably increases the signal-to-noise ratio. Furthermore, the self-pulsation mode is useful in achieving a high and relatively flat signal-to-noise ratio (versus front facet reflectance), making the device particularly useful as the read laser source in CD laser devices.

An important problem presented in self-pulsation laser diodes is the production of such diodes at a relatively high yield (and corresponding affordable cost). This is due, at least in part, to the fact that for most practical materials, the separation of the laser layers, particularly the separation between the active layer and the current blocking layer, must be relatively greater than in single mode lasers and must be controlled fairly carefully. As will be described below, if the desired thickness is achieved, the laser will reliably oscillate in the self-pulsation mode, if it is not, the laser will not and must be scrapped. As will also be described in greater detail below, conventional laser fabrication techniques are not completely suitable for achieving the necessary thickness and thickness control of the layer separating the active layer from the current blocking layer in the laser diode in order to economically produce self-pulsation laser devices at high yield.

More particularly, FIG. 2 illustrates a conventional laser diode of the buried heterojunction type utilizing a central mesa bounded by a pair of current blocking layers which confine current flow, and therefore lasing action to the central stripe below the mesa. In FIG. 2, there is shown a semiconducting substrate 1 comprising n-type GaAs which serves as the base for the semiconductor device. A lower cladding layer 2, preferably n-type $Al_{0.5}Ga_{0.5}$. As is grown on the substrate followed by an active layer which is preferably p-type $Al_{0.15}Ga_{0.85}As$. A second cladding layer 4 comprising p-type $Al_{0.5}Ga_{0.5}$. As is grown on the active layer. Subsequent to growth of the upper cladding layer 4, the device is masked and etched to produce a mesa generally indicated at 10 bounded by a pair of side regions 11, 12 from which the p AlGaAs material of the upper cladding layer has been removed. As shown in FIG. 2, the mesa has a width designated W and the upper cladding layer adjacent the regions 11, 12 is reduced to a relatively small thickness designated a. In the completed device, those parameters, when the diode is energized, cause lasing action in the region generally designated A.

Following etching of the mesa 10, the partly completed device is returned to the epitaxial growth apparatus and current blocking layer 5 of n-type GaAs is grown to fill the regions 11, 12 from which the p-type AlGaAs upper cladding material had been removed. Following growth of the current blocking layer, a p-type GaAs contact layer 6 is grown to complete the epitaxial growth process. Electrodes 7, 8 are then formed on the substrate and contact layers 1, 6, respectively, in conventional fashion to produce a completed laser diode. When a DC electrical potential is applied to the electrodes with the electrode 8 being maintained positive with respect to the electrode 7, and the current threshold is exceeded, carriers are injected into the active layer 4 in the region designated A to produce lasing action and generate coherent light which is delivered from the front facet of the laser. The current blocking layer 5 provides a reverse biased p-n junction to prevent current flow into the active layer in the regions covered by the current blocking layer, thereby confining the lasing action within the region A. In addition, the fact that the cladding layers have a higher aluminum content than the active layer creates a band gap discontinuity, with the higher band gap material being external to the active layer, thereby tending to confine the electrons and holes in the active region. The junction between the higher aluminum content cladding layers and the lower aluminum content active layer also produces a refractive index discontinuity (with the smaller refractive index in the cladding layers) which tends to confine the radiation (photons) to the active region. Thus, the cladding layers serve as a light guide to assure that the majority of photons generated in the active region are emitted at the front facet of the laser. More particularly, with respect to the photon confinement, a percentage of the light generated in the region A is absorbed in the n-type current blocking layer 5. This results in the production of an effective refractive index discontinuity in the transverse direction between the double heterojunction surface made up of the lower cladding layer 2, active layer 3 and second cladding layer 4, thereby to provide transverse mode stabilization.

Using conventional molar proportions of Al and Ga in the AlGaAs and typical carrier concentrations, a conventional structure as illustrated in FIG. 2 for single mode operation would utilize an active layer 3 having a thickness in the range of about 0.05 to 0.14 microns, a thickness a of the reduced portion of the upper cladding layer of about 0.2 microns and a width of the mesa of about 3.5 microns. Utilizing those dimensions, typically the device will exhibit a single vertical mode oscillation mode as is illustrated in FIG. 4. It is seen that the device oscillates at a particular wavelength to produce high intensity at that wavelength, but is incapable of oscillating at other wavelengths.

If multi-mode operation were desired, it would be necessary to alter the aforementioned dimensions, particularly by increasing the dimension a i.e., the thickness of the reduced portion of the upper cladding layer, to about 0.4 microns, and making the stripe width W about 4.3 microns. When such a structure is realized, the vertical oscillation mode exhibits a self-pulsation behavior as illustrated in FIG. 5, where the laser can operate at a number of wavelengths at related intensities as demonstrated in that figure. In intermediate ranges of the dimensions a and W, such as the condition where a is about 0.3 microns and W is about 3.5 microns, the laser exhibits a multi-vertical mode characteristic where the laser can oscillate at certain wavelengths and not at others. It is important in practicing the invention to produce a laser which has only the self-pulsation mode of operation, and to produce such a laser reliably and at high yield in a production environment.

In the prior art structure, however, although the thickness of the reduced section of the upper cladding layer, i.e., the dimension a, can be controlled by controlling the etching process which produces the mesa, achieving the desired precision of control is difficult. Typically, the etching process a precision of only about If the thickness a is desired to be etched much below 0.2 microns, there is a danger of overetching and entirely removing portions of the upper cladding layer whereupon the etchant will attack the active layer, producing a device which must be rejected. If the goal thickness is too large, the ±10% tolerance of that layer number is often unacceptable. However, when the device is designed to allow for a thickness of about 0.2 microns for the dimension a, it is possible to check that dimension by optical interferometry, as is well known. In that technique, the device is illuminated with infrared radiation, and an optical instrument utilized to discern the color produced by the interference pattern, the color being related to the thickness a of the remaining portion of the upper cladding layer. It is relatively easy to discern the appropriate color or color change when the thickness a is in the neighborhood of 0.2 or 0.3 microns. However, when the thickness gets much beyond 0.3 microns, checking by optical interferometry techniques become difficult and less precise. Thus, in the condition where it is desired to produce a thickness a of about 0.4 microns to assure operation of the laser in the self-pulsation mode, optical interferometric testing of the etched layer will be inadequate, and the accuracy expected of the etching process will typically be unacceptable in producing an economical yield in a production process.

SUMMARY OF THE INVENTION

In view of the foregoing, it is a general aim of the present invention to produce a semiconductor laser device capable of reliably operating in the self-pulsation mode and which can be produced by an economical high yield process.

In that regard, an object of the present invention is to enhance the reliability and precision of the control of the thickness of the upper cladding layer thereby to repeatably provide waveguide characteristics for the semiconductor laser which will assure operation in the self-pulsation mode.

In accordance with the invention, there is provided a semiconductor laser having a substrate supporting first and second cladding layers separated by an active layer. The first and second cladding layers are of opposite conductivity types. All of the cladding layers are of AlGaAs, with the molar proportion of aluminum being higher in the cladding layers than in the active layer. A mesa is etched in the upper cladding layer to form a central stripe bounded by a pair of etched regions which are sufficiently thin to be readily gauged by optical interferometrical techniques. A further epitaxial growth process is then conducted to add a buffer layer to the thinned portion of the upper cladding layer, thereby providing a composite layer. The buffer layer is of AlGaAs and has an aluminum molar proportion comparable to that of the upper cladding layer such that the composite layer provides a waveguide with respect to the active layer, the waveguide being of sufficient thickness to assure operation of the resulting laser in the self-pulsation mode. Preferably, MOCVD techniques are utilized to grow the buffer layer on the thinned section of the upper cladding layer to enhance the controllability and repeatability of the total thickness of the composite layer.

Other objects and advantages will become apparent from the following detailed description when taken in conjunction with the drawings, in which:

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
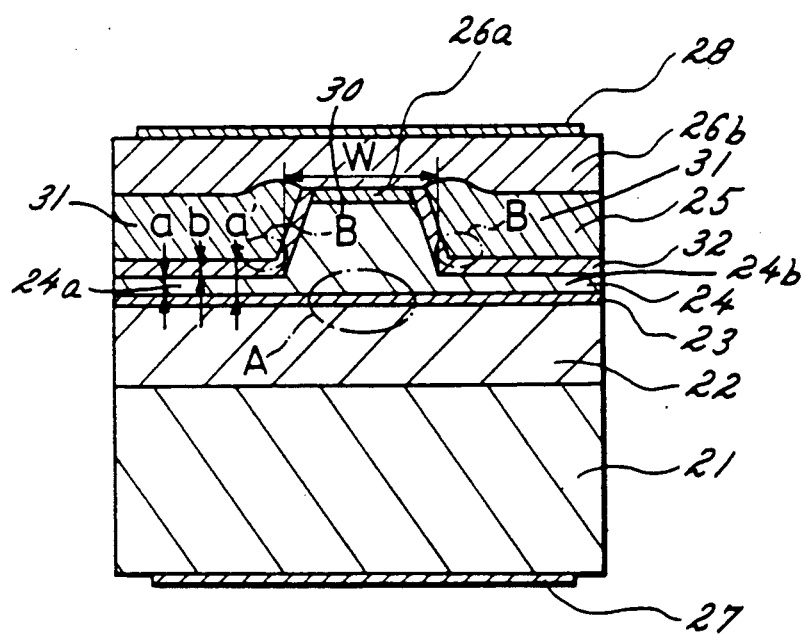
FIG. 1 is a cross-sectional diagram illustrating a semiconductor laser embodying the present invention.

Turning now to FIG. 1, the device itself including its chemical composition and carrier concentration levels will be described before turning to the production process by which it is produced. As in the prior art device, the laser is based on an n-type GaAs substrate 21 on which is grown a lower cladding layer 22 which is n-type AlGaAs preferably with an aluminum molar concentration of about 50% and a carrier concentration of $1 \times 10^{18} cm^{-3}$ A p-type active layer 23 (the active layer in a practical device can be p-type, n-type or undoped) is preferably grown over the lower cladding layer 22. Preferably, the molar concentration of aluminum in the p-type AlGaAs layer 23 is about 15%, and the carrier concentration is about $1 \times 10^{18} cm^{-3}$. AlGaAs upper cladding layer 24 is formed on the active layer 23 and preferably has about a 50% aluminum molar concentration and a carrier concentration level of about $1 \times 10^{17} cm^{-3}$. A contact layer 26a of p-type GaAs is formed over the mesa portion 30.

FIG. 1 illustrates that the upper cladding layer has a mesa 30 formed therein by removal of bordering portions 31 forming a pair of regions into which a current blocking layer can be deposited. It is seen that etching of the upper cladding layer leaves the mesa 30 separated by thinned end portions 24a, 24b having a thickness designated a.

In practicing the invention, a buffer AlGaAs layer 32 is deposited over the upper cladding layer 24 and has aluminum molar proportion similar to that of the upper cladding layer 24, in the present example about 50%. The buffer layer 32 can be of either n-type, p-type or undoped, but is preferably of the same conductivity type as the upper cladding layer 24, in the present example of p-type material. In the preferred practice of the invention, the buffer layer 32 has a carrier concentration of about $5 \times 10^{16}$ to about $1 \times 10^{18} cm^{-3}$. As illustrated in FIG. 1, the buffer layer has a total thickness above the thinned portions 24a, 24b of the upper cladding layer designated b to provide a composite layer comprising the portions 24a, 24b of the upper cladding layer and the overlying portions of the buffer layer which has a total thickness designated a'.

In order to provide current confinement in the active region under the mesa, current blocking layer 25 is provided in the mesa-bordering regions 31 by growing of n-type material, preferably GaAs, and preferably having a carrier concentration of about $5 \times 10^{18} cm^{-3}$. Overlying both the mesa and the current blocking layer is a contact layer 26b of p-type GaAs. Metallic electrodes 27, 28 are formed on the substrate 21 and contact layer 26b respectively to provide terminals for applying electrical potential to the laser device. When such potentials are applied, carriers are injected into the active layer 24 in the region under the mesa 30 to cause laser oscillation in the region generally denoted by the character A.

Figure 3A:
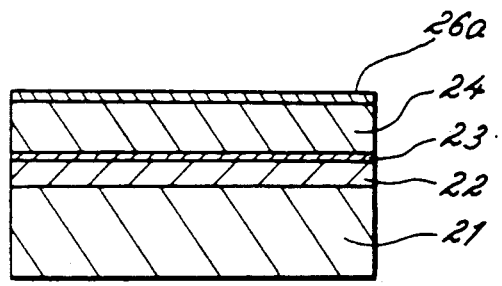
FIGS. 3(a)-3(f) comprise diagrams illustrating the production process for the laser of FIG. 1.
Figure 3B:
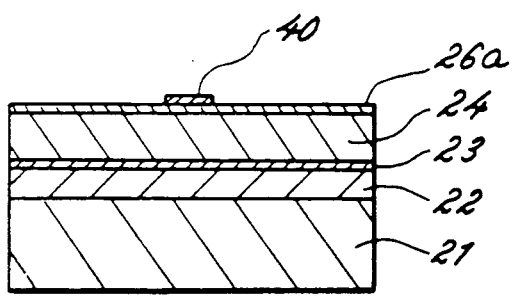
Figure 3C:
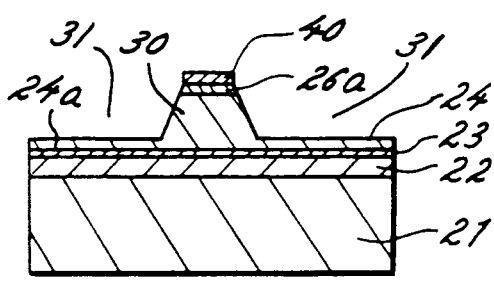

The device of FIG. 1 is produced by the process generally illustrated stepwise in FIGS. 3(a)-3(f). The device of FIG. 3(a) is grown in a first epitaxial growth phase which produces on an n-type GaAs substrate 21 successive layers including n-type lower cladding layer 22, p-type active layer 23, p-type upper cladding layer 24, and p-type GaAs contact layer 26a. After the first phase growth, the device is masked as with a $Si_3N_4$ film 40 which is patterned as illustrated in FIG. 3(b) to protect a central stripe region leaving regions bordering the central stripe unprotected. The device is then etched as by wet etching to produce an unetched central mesa portion 30 as by removing the upper cladding layer from bordering regions 31, leaving thinned portions of upper cladding layer 24a, 24b separating the central mesa 30. As was noted in connection with FIG. 1, the thinned portions 24a, 24b are designated by dimension a. It is also important to note in connection with the preferred practice of the invention that the mesa 30 is a forward mesa, i.e., a mesa which increases in width toward the mesa base. When utilizing a relatively thick composite layer to separate the active layer from the current blocking layer in accordance with the present invention, it is found that device yield substantially increases if the forward mesa configuration is used.

In practicing the invention, the thickness of the portions 24a, 24b is controlled during wet etching by utilization of infrared optical interference techniques to provide a controlled and repeatable thickness such as about 0.2 microns, and in any event less than 0.3 microns. It was noted above that with thicknesses greater than about 0.3 microns, the accuracy of checking and controlling the thickness of regions 24a, 24b is substantially reduced.

Having etched the mesa and created the thin sections 24a, 24b to dimensions sufficiently small for accurate and repeatable control, means are then provided for augmenting the thin sections 24a, 24b with a buffer layer which coacts with the thinned portions of the upper cladding layer to produce a composite layer of sufficient thickness to cause the resulting laser device to reliably operate in the self-pulsation mode.

Figure 3D:
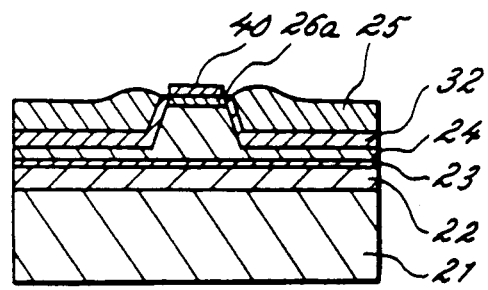

To that end, a further epitaxial growth phase is conducted to deposit a further AlGaAs layer 32 over the upper cladding layer 24, except where the layer is protected by the still-present SiN mask 40. The deposition of such layer is illustrated in FIG. 3(d). In carrying out the invention, the deposition of the layer 32 utilizes techniques which are capable of accurate thickness control, preferably MOCVD (metal organic chemical vapor deposition). It is well known that the thickness of the layers deposited by such a process are very controllable and thus the approximately 0.2 micron thickness of the sections 24a, 24b can be augmented by the required amount to produce a thicker layer such as about 0.4 microns with accuracy much greater than could be utilized by growth followed by conventional etching techniques. Importantly, the aluminum content of the buffer layer 32 is about the same as that of the upper cladding layer 24, in the present example, about 50% and substantially greater than that of the active layer. As a result the buffer and upper cladding layers function as one to present both a band gap discontinuity of about the same amount to the active layer as well as a refractive index discontinuity of about the same amount to the active layer.

Figure 3E:
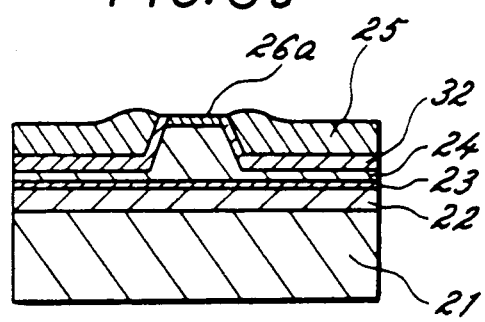
Figure 3F:
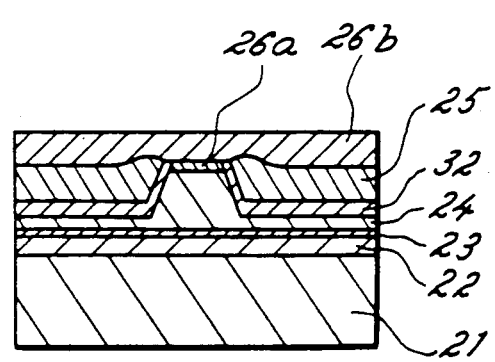
Figure 4:
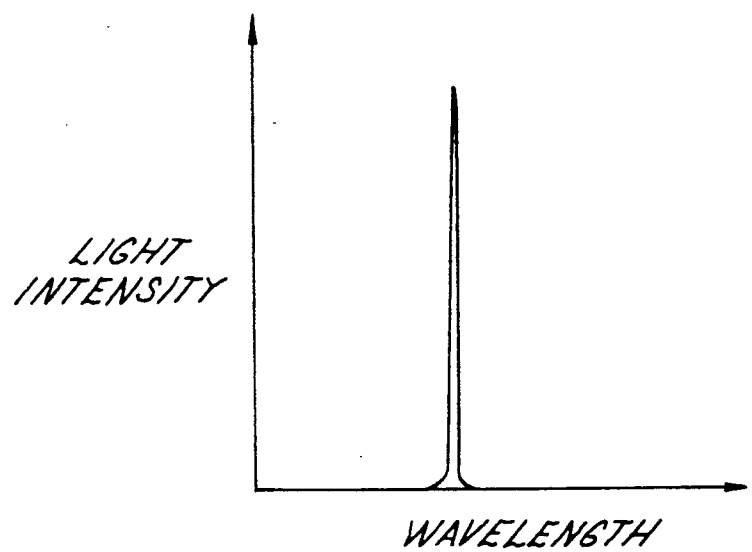
FIG. 4 is a diagram illustrating laser operation in a single vertical mode as can be accomplished with the prior art laser of FIG. 2.
Figure 5:
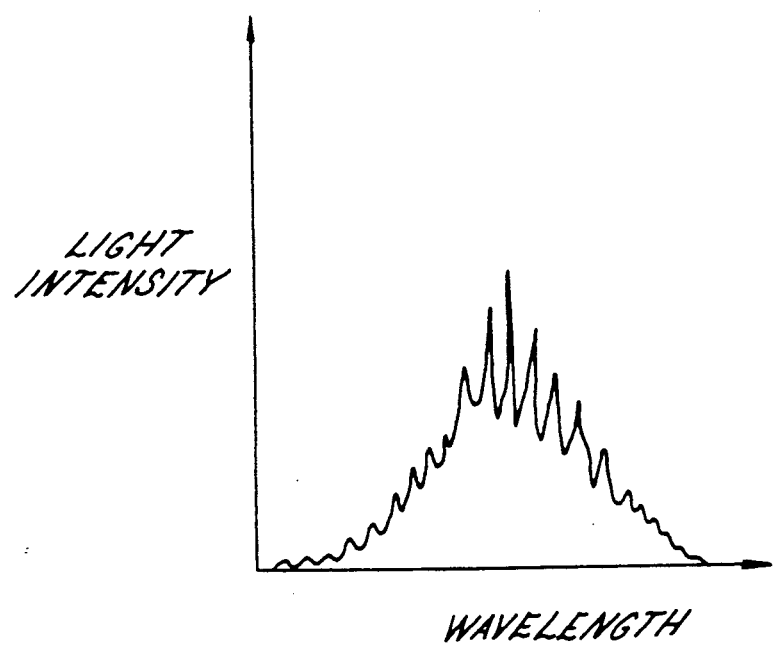
FIG. 5 is a diagram illustrating laser operation in the self-pulsation mode which can be reliably and repeatedly achieved in practicing the present invention.

As illustrated in FIG. 3(d), after the AlGaAs buffer layer 32 is produced, the MOCVD process is continued to deposit current blocking layer 25 in the regions 31 from which the upper cladding layer had been etched. The current blocking layer is n-type GaAs, providing a reverse biased p-n junction between the current blocking layer and composite layer 32, 24, preventing current flow into the active layer 23 except under the mesa 30, thereby confining the recombinations to the region A (FIG. 1) under the mesa. After deposition of the current blocking layer 25, the silicon nitride mask 40 is removed as shown in FIG. 3(e), and contact layer 26b applied, by continuation of the MOCVD crystal growth to provide the p-type contact layer 26b. Following the completion of the final epitaxial growth phase, electrodes are deposited as by sputtering and patterned to produce the completed device as shown in FIG. 1.

Figure 2:
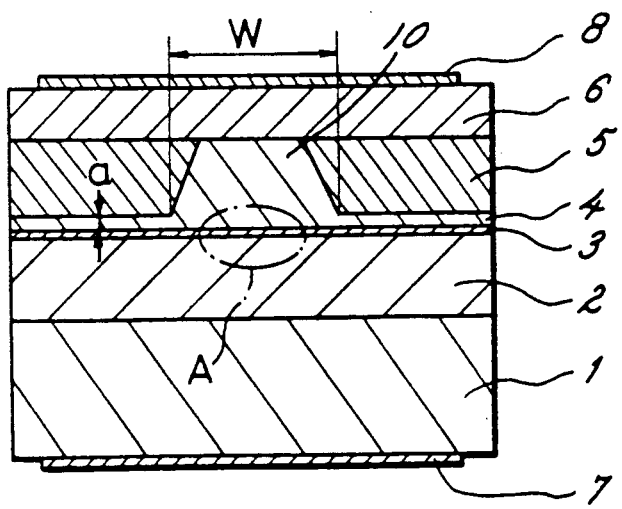
FIG. 2 is a cross-sectional diagram illustration showing a semiconductor laser constructed in accordance with the prior art.

As in the prior art device of FIG. 2, the laser of FIG. 1 is operated by applying a DC potential between p-side electrode 28 and n-side electrode 27. The current blocking layer 25 at either side of the mesa will confine current flow through the mesa region 30, causing carrier recombinations in the region A, and thus producing lasing action in that region. In the embodiment according to the present invention, the distance a' between the upper surface of the active layer 23 and the lower surface of the current blocking layer 25 is established by the composite layer comprising thinned portions 24a, 24b of the upper cladding layer added to the buffer layer 32 of similar chemical composition. As a result, the laser oscillation mode is determined by the carrier concentration injected into the laser oscillation region A, the density of light produced in that region, and by the fact that the light waveguiding effect due to the light absorption at the regions B where the composite layer intersects the mesa is well-balanced. This balance is largely affected by the dimensions of the thickness of the active layer 24, the width W of the mesa region 30, and the distance a' between the active layer and the current blocking layer. As in the prior art, the thickness of the active layer 23 and the width W of the mesa can be controlled by the growth process for the active layer and the masking and etching process of the mesa, respectively. However, in substantial improvement over the prior art, the relatively large thickness of the composite layer a' is better controlled in that the etching to produce the thinned sections 24a, 24b is accomplished at the optimum thickness for that operation, i.e., at about 0.2 microns, and the composite layer is then supplemented by a highly controllable technique such as MOCVD which utilizes a very slow growth rate and thereby provides an extreme degree of thickness control.

In the prior art, if it were desired, for example, to utilize wet etching to produce a thickness of 0.4 microns for the upper cladding layer, and that thickness were only controllable to within a tolerance of about ±10%, the total range of the final thickness would be from about 0.36 to 0.44 microns. However, if in practicing the invention the thickness of the sections 24a, 24b is targeted at about 0.2 microns, and the same wet etching process with the same controllability is used, that layer will be etched to a total thickness of about 0.18 to about 0.22 microns. If the very controllable MOCVD process is then used to add about 0.2 microns to form a total composite layer, such composite layer will have tolerances no worse than about 0.38 to about 0.42 microns, a very substantial improvement over that available in the prior art.

Moreover, since optical interferometry is used to check the thickness of the layers 24a, 24b after etching and before MOCVD deposition of the buffer layer, it is possible to derive a measure of the actual thickness achieved by the etching process and to control the time or other parameters of the MOCVD process to arrive at the target total composite thickness with each greater precision.

In certain examples of the invention, it may be desirable to further control the carrier concentration or the dopant within the buffer layer 32 or the molar aluminum proportion as a further means of adjusting the mode of oscillation of the laser.

In addition, in some circumstances, it also may be desirable to grade the aluminum composition of the buffer layer from a level approximating that of the upper cladding layer at the junction of the upper cladding layer to substantially zero or at least a somewhat lesser level at the boundary with the current blocking layer 25.

It will now be apparent that what has been provided is a method of reliably producing a semiconductor laser with a relatively thick composite layer separating the active layer and current blocking layer at either side of a mesa, but which can achieve such relatively thick separating composite layer at high yield. An upper cladding layer is grown over the active layer as is conventional, and the upper cladding layer is etched to produce a mesa, but the etching is continued until the regions bordering the mesa are much thinner than would normally be desired for the device. Subsequently, an MOCVD deposition process is used to form a buffer layer on the upper cladding layer, the buffer layer having a chemical composition similar to that of the upper cladding layer, and the combined buffer and upper cladding layers having a thickness necessary to provide the completed laser device with a self-pulsation operating characteristic. The similarity in chemical composition of the upper cladding layer and buffer layer cause those layers to function as a composite to produce carrier confinement in the region of the active layer under the mesa while providing the necessary refractive and band gap discontinuity to cause self-pulsation operation. With the control available according to the present invention, such laser devices can be produced at high yield and therefore at acceptable economics.

What is claimed is:

1. A method of producing a semiconductor laser device capable of oscillation in a self-pulsation mode, said method comprising the steps of:

growing a lower cladding layer, an active layer and an upper cladding layer on a semiconductive substrate, the cladding layers and the active layer all being of AlGaAs with the aluminum molar proportion of the active layer being lower than that of the cladding layers, the cladding layers being of opposite conductivity types thereby to form a p-n junction at the active layer;

etching the upper cladding layer to form a central mesa separated by comparatively thin sections of the upper cladding layer, the thin sections being of sufficient thinness to be readily gauged by optical interferometrical techniques;

using MOCVD techniques to grow a buffer layer over the thin etched portions of the upper cladding layer of predetermined thickness, the buffer layer being of AlGaAs and having an aluminum content which is substantially the same as that of the upper cladding layer such that said buffer layer and upper cladding layer function as a composite layer having a combined refractive index mismatched with that of the active layer;

growing a current blocking layer over the buffer layer, and forming a contact layer and electrodes to produce a completed semiconductor device having a p-n junction at the active layer so that when said device is energized carriers are injected into the active layer in the region defined by the mesa;

the thickness of the composite cladding and buffer layers being coordinated to the width of the mesa to produce a sufficiently thick composite layer for causing said laser when energized to function in the self-pulsation mode.

2. The method according to claim 1 in which the mesa is a forward mesa.

3. The method according to claim 1 in which the buffer layer is of the same conductivity type as the upper cladding layer.

4. A method of producing a semiconductor laser device capable of oscillation in a self-pulsation mode, said method comprising the steps of:

growing a lower cladding layer, an active layer and an upper cladding layer on a semiconductive substrate, the cladding layers and the active layer all being of AlGaAs with the aluminum molar proportion of the active layer being lower than that of the cladding layers, the cladding layers being of opposite conductivity types thereby to form a p-n junction at the active layer;

etching the upper cladding layer to form a central mesa separated by comparatively thin sections of the upper cladding layer, the thin sections of the upper cladding layer being no more than about 0.3 microns in thickness;

using MOCVD techniques to grow a buffer layer over the thin etched portions of the upper cladding layer of predetermined thickness, the buffer layer being of AlGaAs to produce with the thin sections of the upper cladding layer a composite layer having a combined refractive index mismatched with that of the active layer;

growing a current blocking layer over the buffer layer, and forming a contact layer and electrodes to produce a completed semiconductor device having a p-n junction at the active layer so that when said device is energized carriers are injected into the active layer in the region defined by the mesa;

the thickness of the composite cladding and buffer layers being coordinated to the width of the mesa to produce a sufficiently thick composite layer for causing said laser when energized to function in the self-pulsation mode.

5. The method according to claim 4 in which the mesa is a forward mesa.

6. The method according to claim 4 in which the buffer layer is of the same conductivity type as the upper cladding layer.

* * * * *